(12) United States Patent
Lee et al.

(10) Patent No.: US 12,471,454 B2
(45) Date of Patent: Nov. 11, 2025

(54) DISPLAY DEVICE AND METHOD OF MANUFACTURING THE SAME

(71) Applicant: SAMSUNG DISPLAY CO., LTD., Yongin-si (KR)

(72) Inventors: Jeongseok Lee, Yongin-si (KR); Seungwook Kwon, Hwaseong-si (KR); Sehoon Jeong, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 646 days.

(21) Appl. No.: 17/533,766

(22) Filed: Nov. 23, 2021

(65) Prior Publication Data

US 2022/0165987 A1 May 26, 2022

(30) Foreign Application Priority Data

Nov. 26, 2020 (KR) .......................... 10-2020-0160834

(51) Int. Cl.
| | |
|---|---|
| *H10K 59/126* | (2023.01) |
| *H10K 59/122* | (2023.01) |
| *H10K 59/80* | (2023.01) |
| *H10K 77/10* | (2023.01) |
| *H10K 102/00* | (2023.01) |

(52) U.S. Cl.
CPC ......... *H10K 59/126* (2023.02); *H10K 59/122* (2023.02); *H10K 59/873* (2023.02); *H10K 77/111* (2023.02); *H10K 2102/311* (2023.02); *H10K 2102/351* (2023.02)

(58) Field of Classification Search
CPC .... H10K 50/844; H10K 71/00; H10K 59/122; H10K 77/111; H10K 2102/311; H10K 2102/351; H10K 59/873; H10K 71/135; H10K 59/126; H10K 59/1213; H10K 59/123; H10K 59/1315; H10K 59/1201; H01L 27/1218
See application file for complete search history.

(56) References Cited

U.S. PATENT DOCUMENTS

| | | | |
|---|---|---|---|
| 10,796,125 B2* | 10/2020 | Gong | .................. G06V 40/1306 |
| 2010/0118243 A1* | 5/2010 | Majumdar | ............. H05K 3/046 |
| | | | 428/323 |
| 2017/0098688 A1* | 4/2017 | Chang | ................ H10K 59/8723 |

(Continued)

FOREIGN PATENT DOCUMENTS

| | | | | | |
|---|---|---|---|---|---|
| CN | 101501832 A | * | 8/2009 | ....... | G02F 1/133305 |
| CN | 103038568 A | * | 4/2013 | ............. | F21K 9/232 |

(Continued)

OTHER PUBLICATIONS

Korean Office Action Cited in Korean Patent Application No. 10-2020-0160834, Dated Jul. 14, 2025.

*Primary Examiner* — Mohammed Shamsuzzaman
(74) *Attorney, Agent, or Firm* — F. CHAU & ASSOCIATES, LLC (57) ABSTRACT

A display device includes a lower film. A light absorbing layer is disposed on the lower film. The light absorbing layer absorbs ultraviolet light. A substrate is disposed on the light absorbing layer. A thin film transistor is disposed on the substrate and includes a gate electrode, a source electrode and a drain electrode. A light emitting diode is disposed on the thin film transistor and is electrically connected to the thin film transistor.

9 Claims, 8 Drawing Sheets

(56) References Cited

U.S. PATENT DOCUMENTS

| | | | |
|---|---|---|---|
| 2018/0088631 A1* | 3/2018 | Park | .................. H10K 59/8722 |
| 2018/0162095 A1 | 6/2018 | Lim et al. | |
| 2019/0197282 A1* | 6/2019 | Gong | ................ G06V 40/1329 |
| 2019/0280017 A1 | 9/2019 | Sung et al. | |
| 2020/0266368 A1* | 8/2020 | Park | ....................... H10K 50/87 |
| 2021/0399076 A1* | 12/2021 | Lee | ..................... H10K 59/131 |
| 2022/0052282 A1* | 2/2022 | Lee | ........................ B32B 27/16 |
| 2022/0093579 A1* | 3/2022 | Kishimoto | ............ H01L 27/156 |
| 2022/0271253 A1* | 8/2022 | Jeon | ..................... H10K 59/871 |
| 2022/0334616 A1* | 10/2022 | Lee | ........................ G06F 1/189 |
| 2023/0189620 A1* | 6/2023 | Doe | ................ H10K 59/80515 257/40 |

FOREIGN PATENT DOCUMENTS

| | | | | | |
|---|---|---|---|---|---|
| CN | 103782091 B | * | 3/2017 | ........... | G02B 6/0031 |
| CN | 107026244 A | * | 8/2017 | ........... | H01L 27/322 |
| CN | 107565053 A | * | 1/2018 | ......... | H01L 27/1218 |
| CN | 108899346 A | * | 11/2018 | ......... | H01L 27/3244 |
| CN | 106019826 B | * | 3/2020 | ............ | G02B 5/201 |
| CN | 113497207 A | * | 10/2021 | ........ | B32B 37/1284 |
| DE | 202021102972 U1 | * | 9/2021 | ........... | G06F 1/1624 |
| EP | 3163621 A1 | * | 5/2017 | ......... | H01L 27/1218 |
| EP | 3457392 A1 | * | 3/2019 | ........... | G06F 3/0412 |
| EP | 3716008 A1 | * | 9/2020 | ............... | G06F 1/16 |
| KR | 10-2017-0050729 | | 5/2017 | | |
| KR | 10-2018-0068382 A | | 6/2018 | | |
| KR | 10-2019-0006113 | | 1/2019 | | |
| KR | 10-2019-0107214 A | | 9/2019 | | |
| TW | 201520036 A | * | 6/2015 | ............. | C03C 17/22 |
| WO | WO-2012068543 A1 | * | 5/2012 | ............. | F21K 9/232 |
| WO | WO-2012121372 A1 | * | 9/2012 | ....... | G02F 1/133512 |
| WO | WO-2018118467 A2 | * | 6/2018 | ............. | C03C 17/30 |
| WO | WO-2021116908 A1 | * | 6/2021 | ............. | B32B 27/08 |

\* cited by examiner

DISPLAY DEVICE AND METHOD OF MANUFACTURING THE SAME

This application claims priority under 35 U.S.C. § 119 to Korean Patent Application No. 10-2020-0160834, filed on Nov. 26, 2020 in the Korean Intellectual Property Office, the disclosure of which is incorporated by reference in its entirety herein.

1. TECHNICAL FIELD

The present inventive concepts relate to a display device and a method of manufacturing the display device.

2. DISCUSSION OF RELATED ART

A display device is a device that displays an image for providing visual information to a user. There are various different types of display devices, such as an organic light emitting diode display. Organic light emitting diode displays are becoming increasingly popular in the electronic industry.

The organic light emitting diode display has a self emission characteristic and does not require a separate light source unlike a liquid crystal display device. Therefore, a thickness and a weight may be reduced as compared to other display devices. In addition, the organic light emitting display device exhibits high quality characteristics such as low power consumption, high luminance and high reaction speed.

SUMMARY

Embodiments provide a display device having a decreased occurrence of an afterimage effect.

Embodiments provide a method of manufacturing a display device having a decreased occurrence of an afterimage effect.

According to an embodiment of the present inventive concepts, a display device includes a lower film. A light absorbing layer is disposed on the lower film. The light absorbing layer is configured to absorb ultraviolet light. A substrate is disposed on the light absorbing layer. A thin film transistor is disposed on the substrate and includes a gate electrode, a source electrode and a drain electrode. A light emitting diode is disposed on the thin film transistor and is electrically connected to the thin film transistor.

In an embodiment, the substrate may include polyimide (PI).

In an embodiment, the substrate may be electrically neutral or quasineutral.

In an embodiment, a transmittance of the light absorbing layer with respect to the ultraviolet light may be about 10% or less.

In an embodiment, the light absorbing layer may include at least one of graphene, carbon nanotube, graphene oxide and reduced graphene oxide.

In an embodiment, a modulus of the light absorbing layer may be in a range from about 0.1 MPa to about 250 MPa.

In an embodiment, a thickness of the light absorbing layer may be in a range from about 1 micrometer to about 25 micrometers.

In an embodiment, the lower film further may include a third area having a third modulus different from the first modulus, the first area may be disposed between the second area and the third area, and the second modulus and the third modulus may be greater than the first modulus.

In an embodiment, the first area may be a bendable portion, and the second area and the third area may be a non-bendable portion.

In an embodiment, the first area may be disposed in a center of the lower film, the second area may be disposed in a corner of the lower film, and the first modulus may be greater than the second modulus.

According to an embodiment of the present inventive concepts, a display device includes a lower film including a first area having a first thickness and a second area having a second thickness different from the first thickness. A light absorbing layer is disposed on the lower film. The light absorbing layer is configured to absorb ultraviolet light. A substrate is disposed on the light absorbing layer. A thin film transistor is disposed on the substrate and includes a gate electrode, a source electrode and a drain electrode. A light emitting diode is disposed on the thin film transistor and is electrically connected to the thin film transistor.

In an embodiment, the first area may be disposed in a center of the lower film, the second area may be disposed in an edge of the lower film and surrounding the first area, and the first thickness may be less than the second thickness.

In an embodiment, the substrate may include polyimide (PI).

In an embodiment, a transmittance of the light absorbing layer with respect to the ultraviolet light may be about 10% or less.

According to an embodiment of the present inventive concepts, a method of manufacturing a display device includes providing a substrate. A light absorbing layer is formed that is configured to absorb ultraviolet light on the substrate. A lower film is formed on the light absorbing layer. The lower film is irradiated with the ultraviolet light.

In an embodiment, the method may further include patterning the lower film before irradiating the lower film with the ultraviolet light.

In an embodiment, the lower film may include a first area and a second area, and wherein the first area and the second area differ in at least one of a modulus, a thickness and a material.

In an embodiment, the lower film may be formed by an inkjet process.

In an embodiment, irradiating the lower film with the ultraviolet light may be curing the lower film.

In an embodiment, the substrate may include polyimide (PI).

The display device according to embodiments may further include a light absorbing layer between a substrate and a lower film. The light absorbing may absorb an ultraviolet light irradiated to the display device. Accordingly, polarization of substrate by the ultraviolet light may be decreased and an afterimage effect of the display device may be improved.

BRIEF DESCRIPTION OF THE DRAWINGS

Illustrative, non-limiting embodiments will be more clearly understood from the following detailed description taken in conjunction with the accompanying drawings.

DETAILED DESCRIPTION OF EMBODIMENTS

Hereinafter, display devices and methods of manufacturing the display devices in accordance with embodiments will be described in more detail with reference to the accompanying drawings. The same reference numerals are used for the same components in the drawings, and redundant descriptions of the same components will be omitted.

Figure 1:
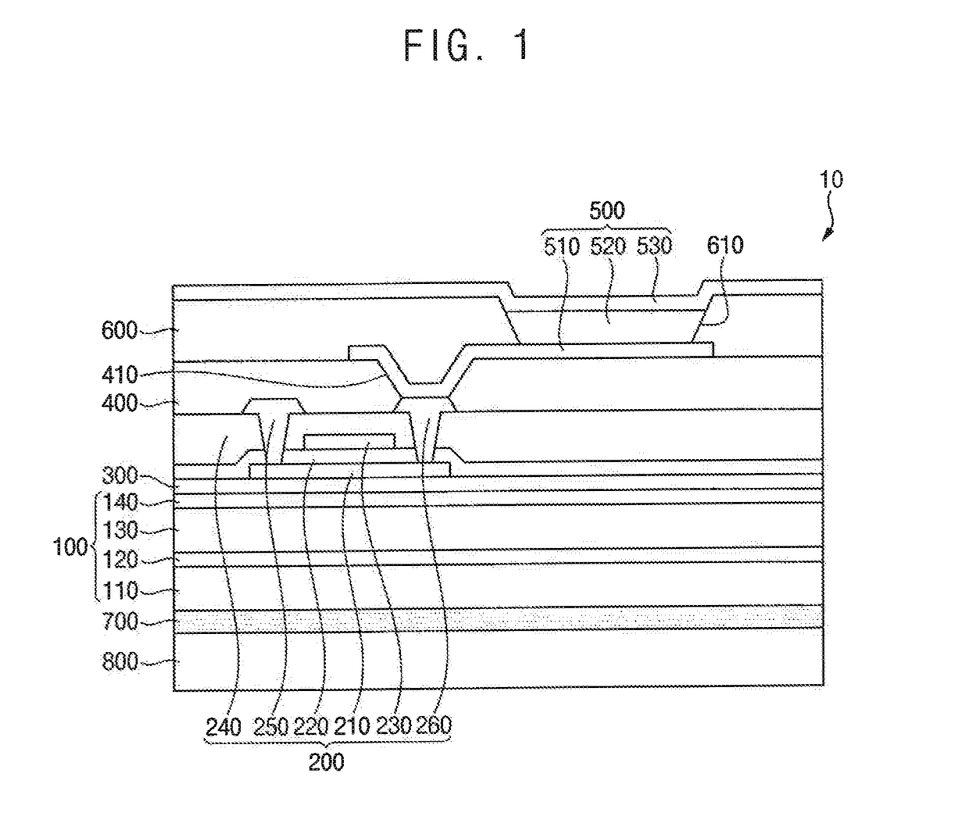
FIG. 1 is a cross-sectional view illustrating a display device according to an embodiment of the present inventive concepts.

FIG. 1 is a cross-sectional view illustrating a display device according to an embodiment.

Referring to the embodiment of FIG. 1, a display device 10 may include a lower film 800, a light absorbing layer 700, a substrate 100, a thin film transistor 200, a buffer layer 300, an insulating layer 400, a light emitting diode 500 and a pixel defining layer 600.

In an embodiment, the substrate 100 may be flexible, stretchable, foldable, bendable, and/or rollable.

The substrate 100 may be a flexible plastic film. For example, the substrate 100 may include polyimide (PI). In an embodiment, the substrate 100 may be a transparent polyimide (PI) film having a low coefficient of thermal expansion (CTE) of about 10 ppm/° C. or less. The coefficient of thermal expansion may be defined as a change in size of the polyimide film according to a change in a unit of temperature. In an embodiment, the polyimide film may be formed by applying and drying a liquid polyimide (PI) on an auxiliary substrate. The substrate 100 may be formed through the process of separating the polyimide film from the auxiliary substrate by using a laser release process. However, embodiments of the present inventive concepts are not limited thereto and the formation of the substrate 100 may vary. In an embodiment, a glass substrate may be used as the auxiliary substrate.

As shown in the embodiment of FIG. 1, the substrate 100 may include a first base layer 110, a first barrier layer 120 disposed on the first base layer 110 (e.g., directly on the first base layer 110 in a direction of the thickness of the display device 10), a second base layer 130 disposed on the first barrier layer 120 (e.g., directly on the first barrier layer 120 in a direction of the thickness of the display device 10) and a second barrier layer 140 disposed on the second base layer 130 (e.g., directly on the second base layer 130 in a direction of the thickness of the display device 10). The substrate 100 may have a multilayer structure in which the first base layer 110, the first barrier layer 120, the second base layer 130 and the second barrier layer 140 are sequentially stacked. However, embodiments of the present inventive concepts are not limited thereto and the number of base layers and barrier layers included in the substrate may vary.

The first base layer 110 and the second base layer 130 may have a same or a different thickness. For example, in an embodiment, each of the first base layer 110 and the second base layer 130 may include polyimide, and may have thickness in a range of about 3 micrometers to about 20 micrometers.

The first barrier layer 120 and the second barrier layer 140 may prevent foreign substances from penetrating inside of the display device 10 through the substrate 100. In an embodiment, the first barrier layer 120 and the second barrier layer 140 may be a single layer and a multilayer including an inorganic material such as silicon nitride (SiNx), and/or silicon oxide (SiOx). The first barrier layer 120 may be a layer for increasing adhesion between adjacent layers. In an embodiment, the first barrier layer 120 may be the multilayer including amorphous silicon and silicon oxide. The second barrier layer 140 may be a silicon oxide layer. In addition, each of the first barrier layer 120 and the second barrier layer 140 may have a thickness in a range of about 4000 Å to about 7000 Å. However, embodiments of the present inventive concepts are not limited thereto.

The thin film transistor 200 may be disposed on the substrate 100. The thin film transistor 200 may include an active layer 210, a gate insulating layer 220, a gate electrode 230, an interlayer insulating layer 240, a source electrode 250, and a drain electrode 260. In an embodiment, the active layer 210 may include at least one compound selected from polycrystalline silicon, amorphous silicon and an oxide semiconductor.

The gate insulating layer 220 may be disposed on the active layer 210. The gate electrode 230 may be disposed on the gate insulating layer 220. The gate electrode 230 may be insulated from the active layer 210 by the gate insulating layer 220. In an embodiment, the gate insulating layer 220 may overlap an entire substrate 100 and may be commonly disposed on a plurality of thin film transistors 200. In an embodiment, the gate insulating layer 220 may include an inorganic insulating material such as silicon oxide (SiOx) or silicon nitride (SiNx).

The buffer layer 300 may be disposed between the gate insulating layer 220 and the substrate 100 (e.g., in a thickness direction of the display device 10). The buffer layer 300 may flatten one surface of the substrate 100 or prevent impurities from being diffused. In an embodiment, the buffer layer 300 may be a multilayer including a silicon oxide ($SiO_2$) and silicon nitride (SiNx). However, embodiments of the present inventive concepts are not limited thereto.

The interlayer insulating layer 240 may be disposed on the gate electrode 230. In an embodiment, the interlayer insulating layer 240 may include an inorganic insulating material or an organic insulating material. The source electrode 250 and the drain electrode 260 of the thin film transistor 200, a data line, a signal line, or the like may be disposed on the interlayer insulating film 240. Each of the source electrode 250 and the drain electrode 260 may contact an area of the active layer 210 through openings of the interlayer insulating layer 240, and may be electrically connected to the active layer 210. For example, each of the source electrode 250 and the drain electrode 260 may contact a source area and a drain area.

The thin film transistor 200 shown in the embodiment of FIG. 1 may be referred to as a top-gate transistor because the gate electrode 230 is disposed on the active layer 210. However, the structure of the thin film transistor 200 is not limited thereto, and may be variously changed. For example, in an embodiment, the gate electrode 230 may be a bottom-gate transistor disposed under the active layer 210.

The insulating layer 400 may be disposed on the interlayer insulating layer 240. The insulating layer 400 may remove a step to increase the luminous efficiency of a light emitting layer 520, and may flatten an upper surface of the display device 10. The insulating layer 400 may overlap the thin film transistor 200 and cover the thin film transistor 200. For example the insulating layer 400 may include an organic insulating material. In an embodiment, the organic insulating material may include at least one compound selected from polyimide, polyamide, polyacrylate, unsaturated polyester, epoxy resin, phenol resin, and the like. However, embodiments of the present inventive concepts are not limited thereto. The insulating layer 400 may include a contact hole 410.

The pixel electrode 510 may be disposed on the insulating layer 400. The pixel electrode 510 may overlap a portion of the contact hole 410. The pixel electrode 510 may directly contact at least one of the source electrode 250 and the drain electrode 260 of the thin film transistor 200 through a lower surface of the contact hole 410. For example, as shown in the embodiment of FIG. 1, the pixel electrode 510 may directly contact the drain electrode 260 of the thin film transistor 200.

In an embodiment, the pixel electrode 510 may include a reflective conductive material, a semi-transparent conductive material, or a transparent conductive material. For example, the pixel electrode 510 may include a transparent conductive material such as indium tin oxide (ITO) and indium zinc oxide (IZO), lithium (Li), calcium (Ca), aluminum (Al), silver (Ag), magnesium (Mg) and gold (Au). However, embodiments of the present inventive concepts are not limited thereto.

The pixel defining layer 600 may be disposed on the insulating layer 400 and the pixel electrode 510. As shown in the embodiment of FIG. 1, the pixel defining layer 600 may overlap a partial portion of the pixel electrode 510. The pixel defining layer 600 may absorb a light coming from the outside through an opening 610. The pixel defining layer 600 may also absorb a light reflected by the pixel electrode 510.

The pixel defining layer 600 may have the opening 610 overlapping the pixel electrode 510. The opening 610 of the pixel defining layer 600 may define an area corresponding to a pixel. In an embodiment, the opening 610 may have a polygonal shape or a circular shape in a plan view. However, embodiments of the present inventive concepts are not limited thereto.

In an embodiment, the pixel defining layer 600 may include an organic insulating material such as polyimide, polyacrylate, or polyamide. However, embodiments of the present inventive concepts are not limited thereto and the material of the pixel defining layer 600 may vary.

The light emitting layer 520 may be disposed on the pixel electrode 510. In an embodiment, a hole injection layer and a hole transport layer may be additionally disposed between the light emitting layer 520 and the pixel electrode 510, and an electron injection layer and an electron transport layer may be additionally disposed between the light emitting layer 520 and the common electrode 530.

The light emitting layer 520 may include a material emitting a light such as red, green, and/or blue light. For example, the light emitting layer 520 may include a first light emitting layer emitting a light having a first wavelength, a second light emitting layer emitting a light having a second wavelength, and a third light emitting layer emitting a light having a third wavelength. In an embodiment, the light having the first wavelength may represent red, the light having the second wavelength may represent green, and the light having the third wavelength may represent blue. However, embodiments of the present inventive concepts are not limited thereto and the light emitting layer 520 may emit various different colors.

The light emitting layer 520 may have a structure in which organic materials emitting light of different colors are stacked. However, embodiments of the present inventive concepts are not limited thereto. For example, the light emitting layer 520 may include an inorganic material emitting a light such as red, green, and blue.

The common electrode 530 transmitting a common voltage may be disposed on the light emitting layer 520. The common electrode 530 may include a transparent conductive material such as indium tin oxide (ITO), and indium zinc oxide (IZO). The common electrode 530 may be formed to have a light transmittance by stacking metals such as calcium (Ca), barium (Ba), magnesium (Mg), aluminum (Al), and silver (Ag). However, embodiments of the present inventive concepts are not limited thereto.

The pixel electrode 510, the light emitting layer 520, and the common electrode 530 may constitute the light emitting diode 500. In an embodiment, the pixel electrode 510 may be an anode, which is a hole injection electrode, and the common electrode 530 may be a cathode, which is an electron injection electrode. However, embodiments of the present inventive concepts are not limited thereto. For example, the pixel electrode 510 may be a cathode, and the common electrode 530 may be an anode. Holes and electrons may be injected into the light emitting layer 520 from the pixel electrode 510 and the common electrode 530, respectively. The light emitting diode 500 may emit light when an exciton in which the injected holes and electrons are combined falls from an excited state to a ground state.

As shown in the embodiment of FIG. 1, the lower film 800 may be disposed under the substrate 100. The lower film 800 may overlap an entire lower surface of the substrate 100.

In an embodiment, the lower film 800 may have a flexible characteristic. For example, the lower film 800 may be formed of a plastic material such as at least one compound selected from polyurethane, polyethylen terephthalate (PET), polyethylen naphthalate (PEN), polyimide, and the like. However, embodiments of the present inventive concepts are not limited thereto.

In an embodiment, an adhesive layer may be disposed on the lower film 800. The adhesive layer may include an organic material, for example, PSA (Pressure Sensitive Adhesive: pressure sensitive adhesive). The adhesive layer may be disposed between the substrate 100 and the lower film 800 (e.g., in a thickness direction of the display device 10), and the lower film 800 may be attached under the substrate 100 through the adhesive layer.

In an embodiment, a conductive material layer may be further disposed under the lower film 800. When the lower film 800 is attached to the substrate 100, a static electricity may be generated between the substrate 100 and the lower film 800. The static electricity may change an electrical characteristic of the light emitting diode 500. As a result, a reliability of the display device 10 may deteriorate and a stability of driving may deteriorate. Accordingly, the conductive material layer may be disposed under the lower film 800, and the static electricity generated through the conductive material layer may not reach the substrate 100.

The light absorbing layer 700 may be disposed between the substrate 100 and the lower film 800 (e.g., in a thickness direction of the display device 10). The light absorbing layer 700 may be disposed on the lower film 800. The light absorbing layer 700 may be disposed under the substrate 100. For example, as shown in the embodiment of FIG. 1, an upper surface of the light absorbing layer 700 may directly contact a lower surface of the substrate 100 (e.g., a lower surface of the first base layer 110) and a lower surface of the light absorbing layer 700 may directly contact an upper surface of the lower film 800. In an embodiment, the light absorbing layer 700 may be attached to the entire lower surface of the substrate 100. However, embodiments of the present inventive concepts are not limited thereto. For example, in an embodiment, the light absorbing layer 700 may be attached only to a partial portion of the lower surface of the substrate 100.

The light absorbing layer 700 may absorb an ultraviolet light (UV). The ultraviolet light (UV) may be irradiated to the lower film 800 when forming the lower film 800. Since the light absorbing layer 700 is present, the ultraviolet light (UV) may not reach the substrate 100. Accordingly, polarization of the substrate 100 due to ultraviolet light (UV) may be reduced by the light absorbing layer 700.

The light absorbing layer 700 may include a polymer. For example, the light absorbing layer 700 may include polyurethane, polyacrylate, or the like. In addition, the light absorbing layer 700 may include an organic material having excellent light absorption characteristic. For example, the light absorbing layer 700 may include at least one compound selected from graphene, carbon nanotube, graphene oxide, and reduced graphene oxide. For example, in an embodiment, the light absorbing layer 700 may be formed of polyurethane, and may include about 0.1 wt % or more of at least one compound selected from graphene, carbon nanotube, graphene oxide, and reduced graphene oxide.

In an embodiment, a transmittance of the light absorbing layer 700 with respect to ultraviolet light (UV) may be in a range of about 10% or less. For example, when the light absorbing layer 700 includes about 0.1 wt % of at least one of graphene, carbon nanotube, graphene oxide, and reduced graphene oxide, the transmittance of the light absorbing layer 700 with respect to ultraviolet light (UV) may be about 10% or less. That is, the light absorbing layer 700 may absorb about 90% or more of ultraviolet light (UV). An amount of ultraviolet light (UV) reaching the substrate 100 may be about 10% or less of an amount of the existing ultraviolet light (UV). Therefore, the effect of the ultraviolet light (UV) on the substrate 100 may be reduced. A polarization of the polyimide included in the substrate 100 due to ultraviolet light (UV) may be reduced.

In an embodiment, a modulus of the light absorbing layer 700 may be in a range of about 0.1 MPa to about 250 MPa. The modulus may be an elastic modulus indicating a ratio of deformation by stress to stress applied to the light absorbing layer 700. If the modulus is relatively large, a hardness of the light absorbing layer 700 may be relatively high. In addition, when the modulus is relatively small, the light absorbing layer 700 may have more flexible characteristics than when the modulus is large. When the modulus of the light absorbing layer 700 is about 0.1 MPa or less, slipping may occur between the light absorbing layer 700 and the substrate 100 during the pressing process. When the modulus of the light absorbing layer 700 is about 250 MPa or more, the display device 10 may be damaged during a bending process of bending the side portion of the display device 10. For example, since the light absorbing layer 700 has a high hardness, elements disposed above the light absorbing layer 700 of the display device 10 may receive stress, and the elements may be damaged.

In an embodiment, a thickness of the light absorbing layer 700 may be in a range of about 1 micrometer to about 25 micrometers. When the thickness of the light absorbing layer 700 is less than about 1 micrometer, the transmittance of the light absorbing layer 700 with respect to ultraviolet light (UV) may be relatively high. That is, the light absorbing layer 700 may not effectively absorb ultraviolet light (UV). When the thickness of the light absorbing layer 700 is greater than about 25 micrometers, slipping between the light absorbing layer 700 and the substrate 100 may occur during a pressing process.

When the polarization of the polyimide included in the substrate 100 occurs, the substrate 100 may have an electric charge. Since the light absorbing layer 700 of the display device 10 according to an embodiment of the present inventive concepts absorbs the ultraviolet light (UV), the polarization of the polyimide included in the substrate 100 may be reduced. Accordingly, the substrate 100 may be electrically neutral or quasineutral. Electrically neutral may mean that the substrate 100 has no electric charge. Electrically quasi-neutral may mean that individual particles of electrons and ions of the substrate 100 are charged, but the individual particles of electrons and ions are electrically neutral as a whole.

In the prior art, when an ultraviolet light (UV) reaches the substrate, a polarization of a polyimide included in a substrate may occur. If the polarization of polyimide occurs, the substrate may be charged. When the substrate has an electric charge, the electric charge may affect the electrical characteristics of the gate electrode, the pixel electrode, and the common electrode. In addition, when the ultraviolet light (UV) reaches the substrate, a dielectric constant of the polyimide included in the substrate may increase. When the dielectric constant of the polyimide is increased, the polarization of the polyimide may occur. When the dielectric constant and a polarization amount of the polyimide are increased, an afterimage effect may appear on the display device.

The display device 10 according to an embodiment of the present inventive concepts includes the light absorbing layer 700, and the light absorbing layer 700 may absorb the ultraviolet light (UV), so that the ultraviolet light may not reach the polyimide included in the substrate 100. In this embodiment, the dielectric constant and the polarization amount of the polyimide may decrease. Accordingly, the polarization of the polyimide may be reduced, and the occurrence of an afterimage effect may be reduced.

Figure 2:
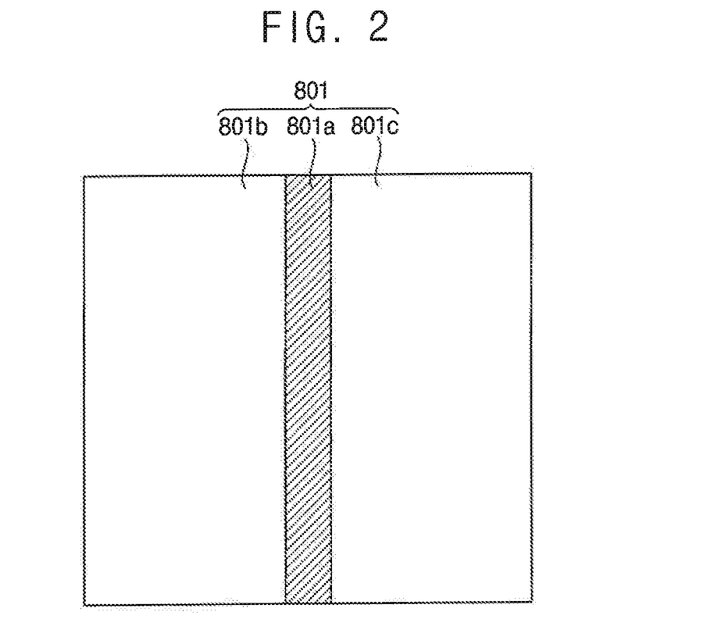
FIG. 2 is a plan view illustrating a lower film of the display device according to an embodiment of the present inventive concepts.

FIG. 2 is a plan view illustrating a lower film of the display device according to an embodiment.

Referring to FIGS. 1 and 2, a lower film 801 of a display device 10 according to an embodiment may include a first area 801a, a second area 801b, and a third area 801c. The first area 801a may have a first modulus, the second area 801b may have a second modulus, and the third area 801c may have a third modulus. The first area 801a may be bendable and may be referred to herein as the bendable portion. Each of the second area 801b and the third area 801c may be non-bendable and may be referred to herein as first and second non-bendable portions, respectively. The bendable portion 801a may be disposed between the first and second non-bendable portions 801b and 801c. As shown in the embodiment of FIG. 2, the bendable portion 801a may be disposed in a center of the lower film 800, and the first and second non-bendable portions 801b and 801c may be respectively disposed on opposite lateral sides of the bendable portion 801a.

In an embodiment, the modulus of each of the first and second non-bendable portions 801b and 801c and the modulus of the bendable portion 801a may be different from each other. The modulus of each of the first and second non-bendable portions 801*b* and 801*c* may be greater than the modulus of the bendable portion 801*a*. The bendable portion 801*a* and the first and second non-bendable portions 801*b* and 801*c* of the lower film 801 may include different materials respectively. The bendable portion 801*a* may include a material having a relatively small modulus. For example, in an embodiment, the bendable portion 801*a* may include polyurethane. The first and second non-bendable portions 801*b* and 801*c* may include a material having a relatively large modulus. For example, the first and second non-bendable portions 801*b* and 801*c* may include polyethylen terephthalate (PET). However, embodiments of the present inventive concepts are not limited thereto.

As described above, since the modulus of each of the first and second non-bendable portions 801*b* and 801*c* is greater than the modulus of the bendable portion 801*a*, the modulus of the first and second non-bendable portions 801*b* and 801*c* may be relatively higher than the modulus of the bendable portion 801*a*. In addition, since the modulus of the bendable portion 801*a* is less than the modulus of each of the first and second non-bendable portions 801*b* and 801*c*, the bendable portion 801*a* may be more flexible than the first and second non-bendable portions 801*b* and 801*c*.

For example, in an embodiment, the display device 10 may include a component in which a central portion of the display device 10 in which the bendable portion 801*a* of the lower film 801 is disposed is folded and unfolded.

Figure 3:
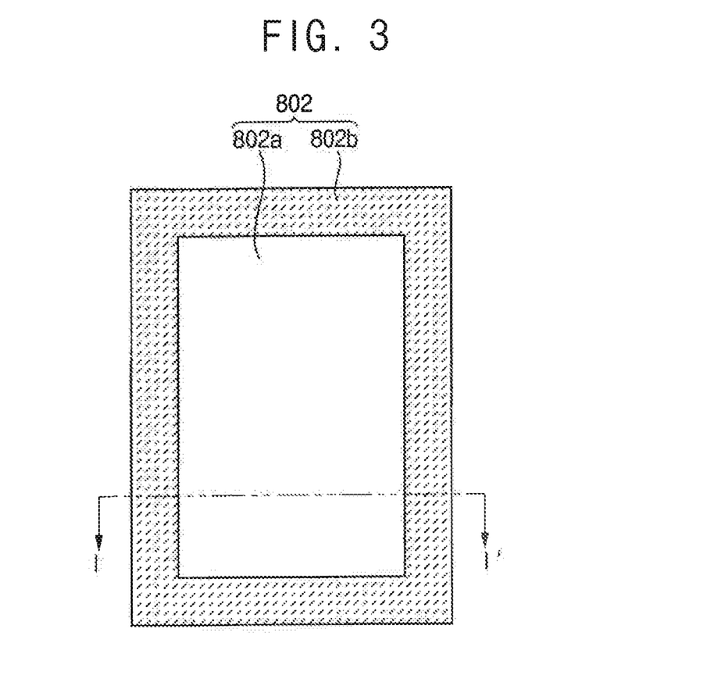
FIG. 3 is a plan view illustrating a lower film of the display device according to an embodiment of the present inventive concepts.
Figure 4:
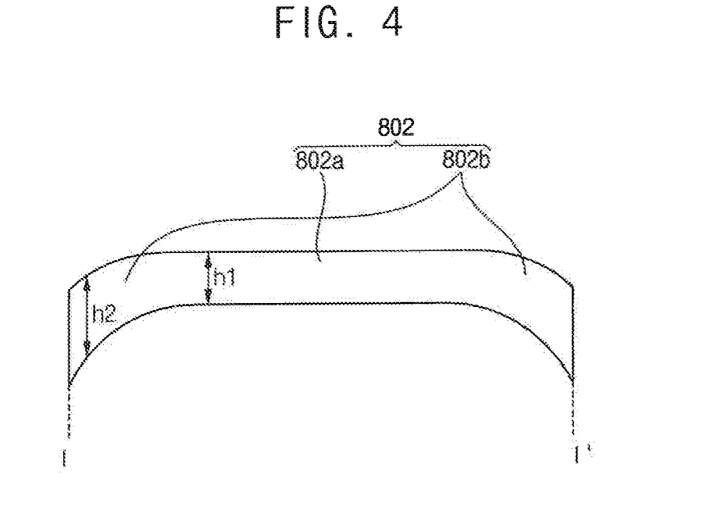
FIG. 4 is a cross-sectional view taken along a line I-I' of FIG. 3 according to an embodiment of the present inventive concepts.

FIG. 3 is a plan view illustrating a lower film of the display device according to an embodiment. FIG. 4 is a cross-sectional view taken along a line I-I' of FIG. 3

Referring to FIGS. 1, 3, and 4, a lower film 802 of the display device 10 according to an embodiment may include a first area 802*a* and a second area 802*b*. The first area 802*a* may have a first thickness, and the second area 802*b* may have a second thickness. As shown in the embodiment of FIG. 3, the first area 802*a* may be a central portion and may be referred herein as the central portion. The second area 802*b* may be a side portion 802*b* and may be referred to herein as the side portion. For example, the lower film 802 may include the central portion 802*a* and the side portion 802*b* surrounding the central portion 802*a*. For example, the side portion 802*b* may be disposed on an edge of the lower film 802 and may completely surround the central portion 802*a* in a plan view. The central portion 802*a* may be disposed in a center of the lower film 802, and the side portion 802*b* may be disposed on four sides of the lower film 802 surrounding the central portion 802*a*.

As shown in the embodiment of FIG. 4, the thickness h1 of the central portion 802*a* and a thickness h2 of the side portion 802*b* may be different from each other. For example, the thickness h1 of the central portion 802*a* may be less than the thickness h2 of the side portion 802*b*. Since the thickness h1 of the central portion 802*a* is formed to be thinner than the thickness h2 of the side portion 802*b*, when a pressure is applied to the lower film 800, a constant pressure may be applied to the central portion 802*a* and the side portion 802*b*.

In an embodiment, the display device 10 may include a component in which a side portion of the display device 10 is rounded. The side portion 802*b* of the lower film 802 may be disposed on the side portion of the display device 10. In this embodiment, all four sides of the display device 10 may be rounded. However, embodiments of the present inventive concepts are not limited thereto and only at least one of the four sides of the display device 10 may be rounded.

Figure 5:
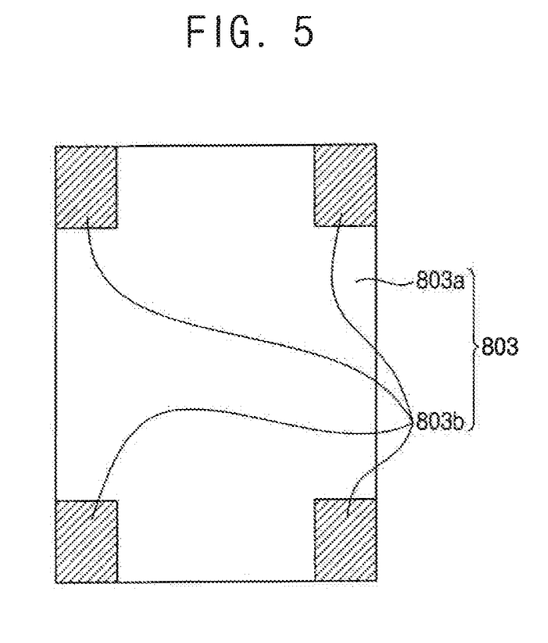
FIG. 5 is a plan view illustrating a lower film of the display device according to an embodiment according to an embodiment of the present inventive concepts.

FIG. 5 is a plan view illustrating a lower film of the display device according to an embodiment.

Referring to FIGS. 1 and 5, a lower film 803 of the display device 10 according to an embodiment may include a first area 803*a* and a second area 803*b*. The first area 803*a* may have a first modulus, and the second area 803*b* may have a second modulus. The first area 803*a* may be a central portion and may be referred to herein as the central portion. The second area 803*b* may be a corner portion and may be referred to herein as the corner portion. That is, the lower film 803 may include the central portion 803*a* and the corner portion 803*b* disposed in at least one corner of the lower film 803. For example, as shown in the embodiment of FIG. 5, the corner portion 803*b* may be disposed in each of the four corners of the rectangular shaped lower film 803. However, embodiments of the present inventive concepts are not limited thereto and the corner portion 803*b* may be disposed in at least one corner of the lower film 803.

The modulus of the central portion 803*a* and the modulus of the corner portion 803*b* may be different from each other. For example, the modulus of the central portion 803*a* may be greater than the modulus of the corner portion 803*b*. The central portion 803*a* and the corner portion 803*b* of the lower film 803 may include different materials, respectively. For example, the central portion 803*a* may include a material having a relatively large modulus. In an embodiment, the central portion 803*a* may include polyurethane. The corner portion 803*b* may include a material having a relatively small modulus. In an embodiment, the corner portion 803*b* may include polyethylen terephthalate (PET). However, embodiments of the present inventive concepts are not limited thereto.

As described above, since the modulus of the central portion 803*a* is greater than the modulus of the corner portion 803*b*, the modulus of the central portion 803*a* may be relatively higher than the modulus of the corner portion 803*b*. In addition, since the modulus of the corner portion 803*b* is less than the modulus of the central portion 803*a*, the corner portion 803*b* may be relatively flexible as compared to the central portion 803*a*.

That is, each corner of the display device 10 where the corner portion 803*b* of the lower film 803 is disposed in may be flexible. However, embodiments of the present inventive concepts are not limited to the arrangements shown in FIGS. 2-5 and the lower film 803 of the display device 10 may include at least one bendable first portion and at least one non-bendable second portion that have various different arrangements with respect to each other.

FIGS. 6, 7, 8, 9, and 10 are cross-sectional views illustrating a method of manufacturing a display device according to embodiments of the present inventive concepts.

Figure 6:
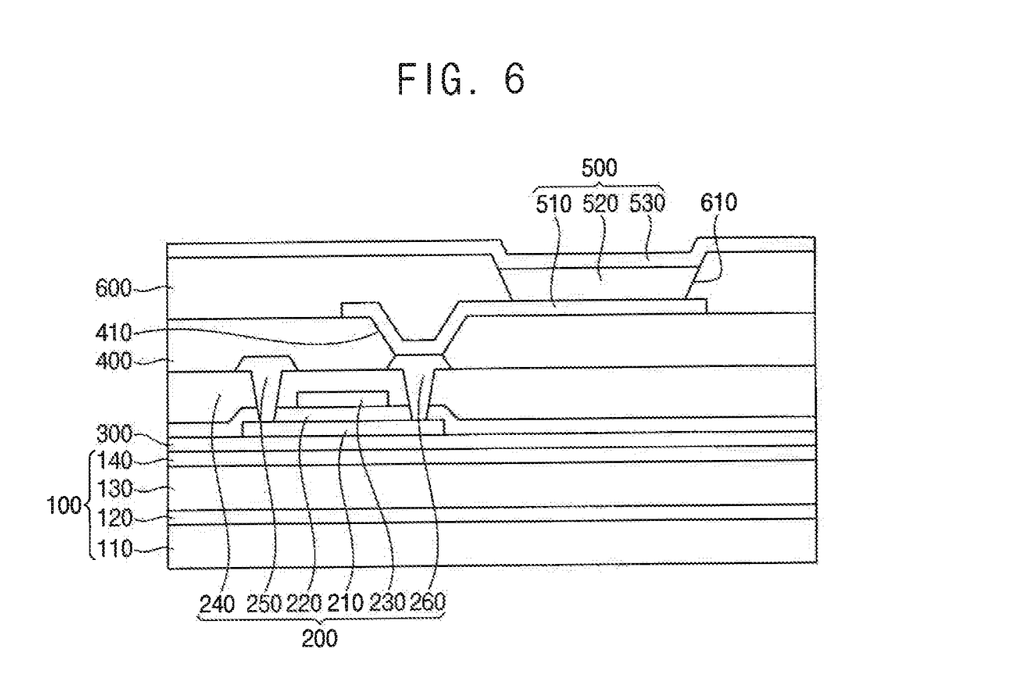
FIGS. 6, 7, 8, 9, and 10 are cross-sectional views illustrating a method of manufacturing a display device according to embodiments of the present inventive concepts.

Referring to FIG. 6, a substrate 100, a thin film transistor 200 and a light emitting diode 500 may be provided.

The substrate 100 may be a flexible plastic film. For example, the substrate 100 may be formed polyimide (PI). In an embodiment, the substrate 100 may be formed by a transparent polyimide (PI) film having a low coefficient of thermal expansion (CTE) of about 10 ppm/° C. or less. The polyimide film may be formed by applying and drying a liquid polyimide (PI) on an auxiliary substrate. The substrate 100 may be formed through the process of separating the polyimide film from the auxiliary substrate by using laser release process. However, embodiments of the present inventive concepts are not limited thereto.

The substrate 100 may include a first base layer 110, a first barrier layer 120 formed on the first base layer 110, a second base layer 130 formed on the first barrier layer 120 and a second barrier layer 140 formed on the second base layer 130. For example, the substrate 100 may be formed by stacking the first base layer 110, the first barrier layer 120, the second base layer 130 and the second barrier layer 140 (e.g., in a direction of the thickness of the display device 11).

The first base layer 110 and the second base layer 130 may have a same or a different thickness. For example, in an embodiment, each of the first base layer 110 and the second base layer 130 may be formed of polyimide, and may have a thickness in a range of about 3 micrometers to about 20 micrometers.

In an embodiment, the first barrier layer 120 and the second barrier layer 140 may be a single layer and a multilayer including an inorganic material such as silicon nitride (SiNx), and/or silicon oxide (SiOx). The first barrier layer 120 may be a layer for increasing adhesion between adjacent layers. The first barrier layer 120 may be formed of a multilayer including amorphous silicon and silicon oxide. The second barrier layer 140 may be formed of a silicon oxide layer. In addition, each of the first barrier layer 120 and the second barrier layer 140 may have a thickness in a range of about 4000 Å to about 7000 Å. However, embodiments of the present inventive concepts are not limited thereto.

Figure 7:
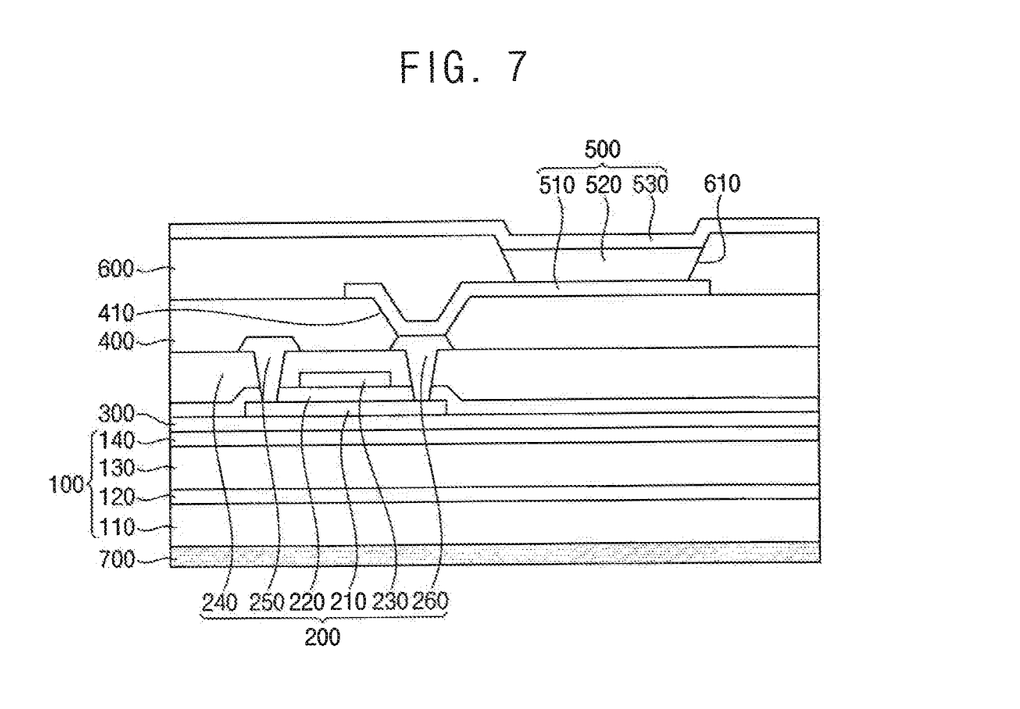

Referring to FIG. 7, the light absorbing layer 700 absorbing the ultraviolet light (UV) may be formed under the substrate 100. For example, as shown in the embodiment of FIG. 7, an upper surface of the light absorbing layer 700 may directly contact a lower surface of the substrate 100.

The light absorbing layer 700 may be formed under the substrate 100. In an embodiment, the light absorbing layer 700 may be formed on the entire lower surface of the substrate 100. However, embodiments of the present inventive concepts are not limited thereto and the light absorbing layer 700 may be attached only to a partial portion of the lower surface of the substrate 100 in some embodiments.

The light absorbing layer 700 may absorb an ultraviolet light (UV). The ultraviolet light (UV) may be irradiated to the lower film 800 when forming the lower film 800. Since the light absorbing layer 700 is present, the ultraviolet light (UV) may not reach the substrate 100. Accordingly, a polarization of the substrate 100 due to the ultraviolet light (UV) may be reduced by the light absorbing layer 700.

When the polarization of the polyimide included in the substrate 100 occurs, the substrate 100 may have an electric charge. Since the light absorbing layer 700 of the display device 10 according to an embodiment absorbs the ultraviolet light (UV), the polarization of the polyimide included in the substrate 100 may be reduced. Accordingly, the substrate 100 may be electrically neutral or quasineutral.

Figure 8:
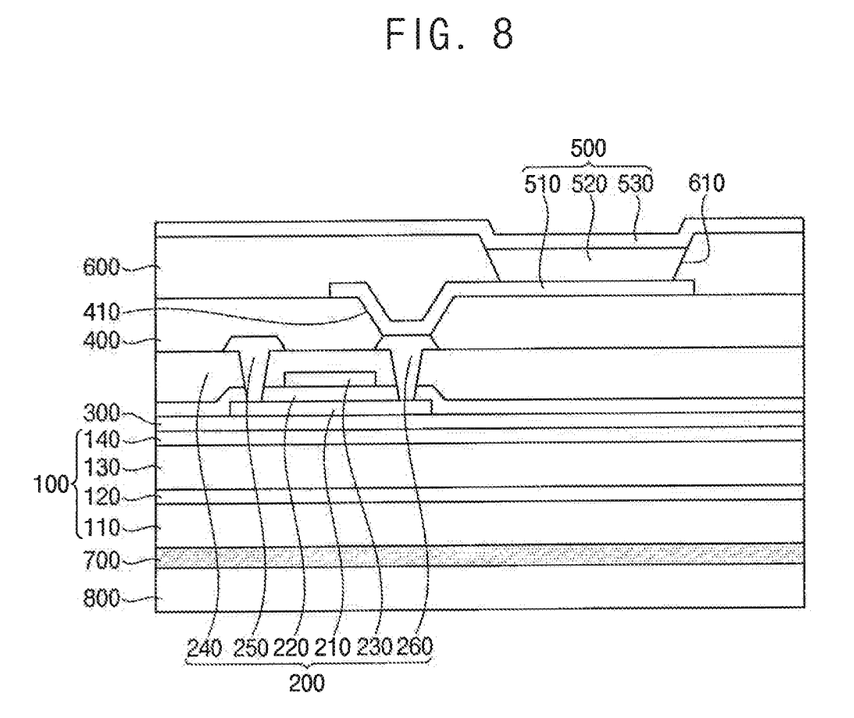

Referring to FIG. 8, the lower film 800 may be formed under the light absorbing layer 700. For example, an upper surface of the lower film 800 may directly contact a lower surface of the light absorbing layer 700. In an embodiment, the lower film 800 may be formed on an entire lower surface of the light absorbing layer 700.

The lower film 800 may have a flexible characteristic. In an embodiment, the lower film 800 may be formed of a plastic material such as polyurethane, polyethylen terephthalate (PET), polyethylen naphthalate (PEN), polyimide, or the like. However, embodiments of the present inventive concepts are not limited thereto.

An adhesive layer may be formed on the lower film 800. In an embodiment, the adhesive layer may be formed of an organic material. The adhesive layer may be disposed between the light absorbing layer 700 and the lower film 800 (e.g., in a thickness direction of the display device 11), and the lower film 800 may be attached under the light absorbing layer 700 through the adhesive layer.

In an embodiment, a conductive material layer may be further formed under the lower film 800. When the lower film 800 is attached to the substrate 100, a static electricity may be generated between the substrate 100 and the lower film 800. The static electricity may change an electrical characteristic of the light emitting diode 500. As a result, a reliability of the display device 10 may deteriorate and a stability of driving may deteriorate. Accordingly, the conductive material layer may be formed under the lower film 800, and the static electricity generated through the conductive material layer may not reach the substrate 100.

Figure 9:
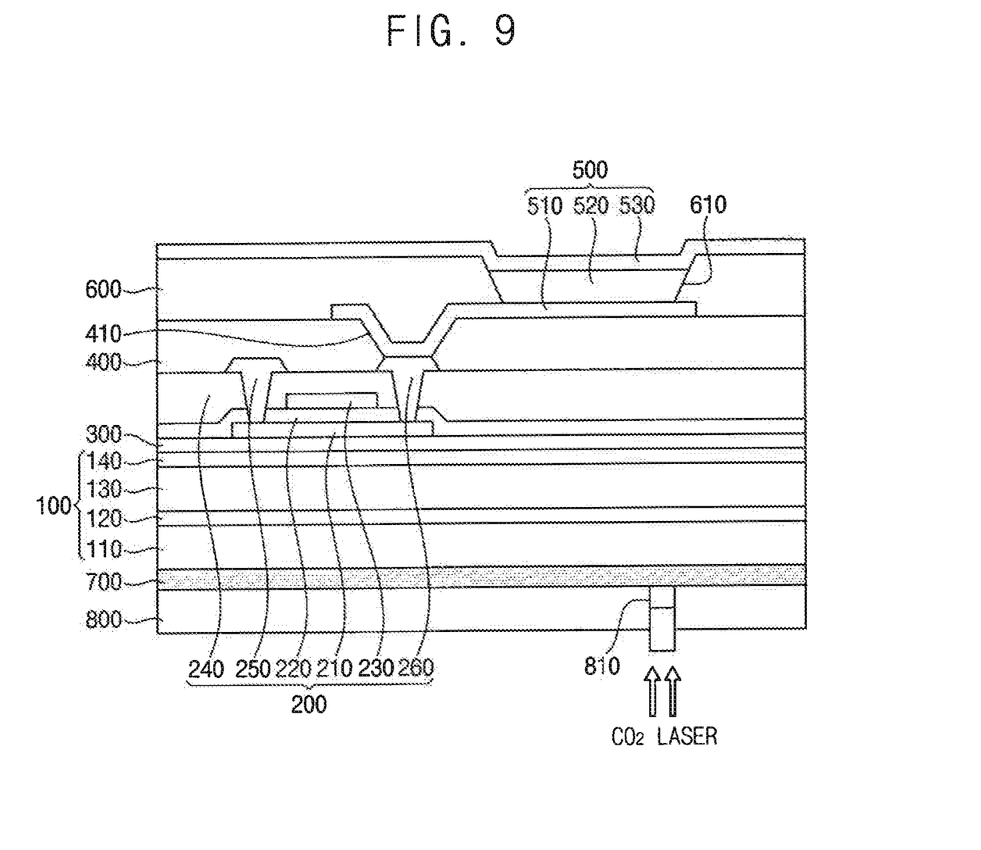
Figure 10:
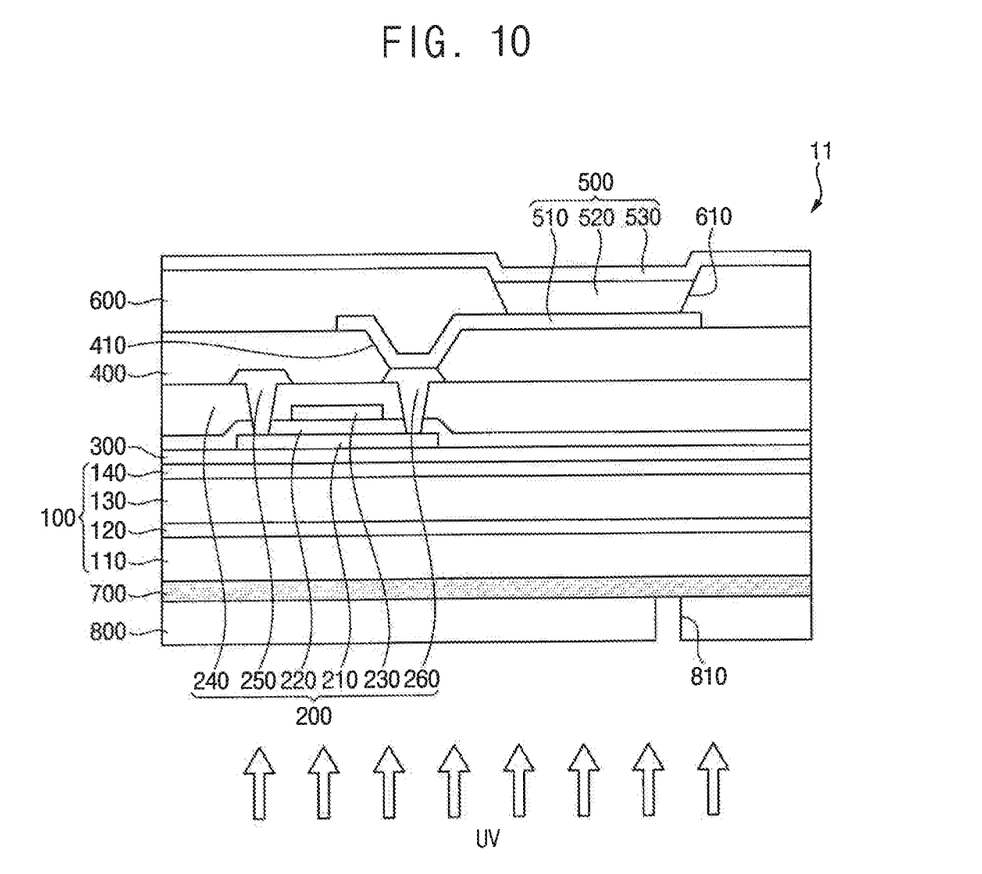

Referring to the embodiments of FIGS. 9 and 10, when forming the lower film 800, an opening 810 may be formed in a portion where the lower film 800 is folded. In an embodiment, the lower film 800 may be manufactured through a patterning process to form the opening 810 of the lower film 800. In an embodiment, in patterning the lower film 800, the opening 810 may be formed by removing a portion of the lower film 800 with a $CO_2$ laser. In an embodiment, the lower film 800 may be weakly adhered to the substrate 100 to easily remove the opening 810. After the process of patterning the lower film 800 is finished, the ultraviolet light (UV) may be irradiated to strongly adhere the lower film 800 to the substrate 100. For example, by irradiating the lower film 800 with ultraviolet light (UV), an adhesion of the lower film 800 to the substrate 100 may be increased.

In the method of manufacturing the display device 11 according to an embodiment of the present inventive concepts, by directly forming the opening 810 in the lower film 800, a manufacturing cost may be reduced. For example, when the opening 810 is directly formed on the lower film 800 by the patterning process, the manufacturing cost of the lower film 800 may be reduced as compared to the case of attaching a lower film in which an opening is formed to the substrate 100. Accordingly, the manufacturing cost of the display device 11 including the lower film 800 may be reduced.

Figure 11:
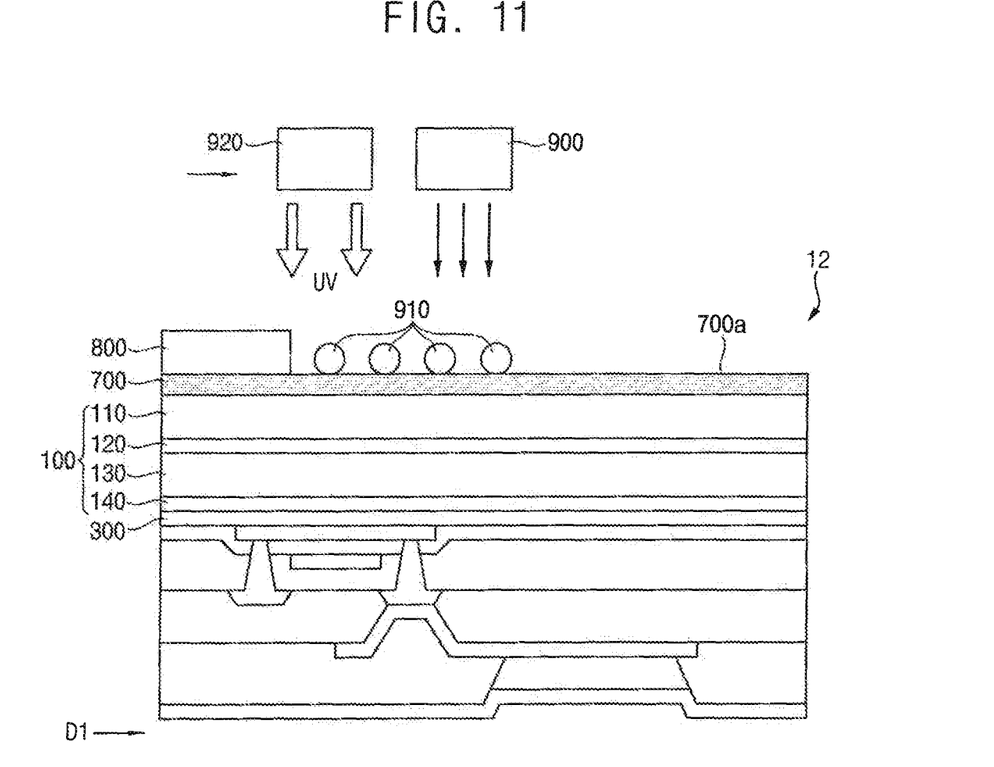
FIG. 11 is a cross-sectional view illustrating a method of manufacturing a display device according to an embodiment of the present inventive concepts.

FIG. 11 is a cross sectional view illustrating a method of manufacturing a display device according to an embodiment.

Referring to the embodiments of FIGS. 6, 7 and 11, a substrate 100, a thin film transistor 200, and a light emitting diode 500 may be provided. In a manufacturing method of the display device 12 described with reference to FIGS. 6, 7 and 11, substantially similar or identical steps as the manufacturing method of the display device 11 described with reference to FIGS. 6 to 10 have been described above, and thus a repeated description may be omitted for convenience of explanation.

The substrate 100 may be formed of a flexible plastic film. For example, the substrate 100 may be formed of polyimide (PI). In an embodiment, the substrate 100 may be formed of a transparent polyimide (PI) film having a low coefficient of thermal expansion (CTE) of about 10 ppm/° C. or less.

The substrate 100 may include a first base layer 110, a first barrier layer 120 formed on the first base layer 110, a second base layer 130 formed on the first barrier layer 120, and a second barrier layer 140 formed on the second base layer 130.

Referring to the embodiment of FIG. 7, a light absorbing layer 700 absorbing an ultraviolet light (UV) may be formed under the substrate 100.

The light absorbing layer 700 may absorb the ultraviolet light (UV). The ultraviolet light (UV) may be irradiated to the lower film 800 when forming the lower film 800. Since the light absorbing layer 700 is present, the ultraviolet light (UV) may not reach the substrate 100. Accordingly, a polarization of the substrate 100 due to ultraviolet light (UV) may be reduced.

Referring to the embodiment of FIG. 11, a lower film 800 may be formed under the light absorbing layer 700. In a manufacturing process, the display device 12 may be inverted and a lower portion of the light absorbing layer 700 may therefore be illustrated as an upper portion of the light absorbing layer 700 in a drawing. The lower film 800 may be formed on an entire lower surface of the light absorbing layer 700.

In an embodiment, the lower film 800 may be formed by an inkjet process. The inkjet device 900 may apply the ink 910 to a first surface 700a of the light absorbing layer 700. A UV curing machine 920 may then cure the applied ink 910. In an embodiment, a viscosity of the ink 910 discharged from the inkjet device 900 may be relatively low. Accordingly, the UV curing machine 920 may cure the ink 910 by irradiating the lower film 800 with the ultraviolet light (UV).

The inkjet device 900 and the UV curing machine 920 may be disposed in a regular interval. The inkjet device 900 and the UV curing machine 920 may be movable. As shown in the embodiment of FIG. 11, the inkjet device 900 and the UV curing machine 920 may move in a first direction D1 that is parallel to an upper surface of the substrate. A device (e.g., a linear motor, etc.) for moving each of the inkjet device 900 and the UV curing machine 920 may be installed in the inkjet device 900 and the UV curing machine 920.

In an embodiment, when the lower film 800 is formed by the inkjet device 900, each portion of the lower film 800 may be formed of a different material. For example, referring to the embodiment of FIC. 2, the bendable portion 801a and the first and second non-bendable portions 801b and 801c of the lower film 801 may be formed of different materials, respectively. The bendable portion 801a may be formed of a material having a relatively small modulus. For example, the bendable portion 801a may be formed of polyurethane. The first and second non-bendable portions 801b and 801c may be formed of a material having a relatively large modulus. For example, the non-bendable portions 801b and 801c may be formed of polyethylen terephthalate (PET). However, embodiments of the present inventive concepts are not limited thereto.

Referring to the embodiment of FIG. 5, the central portion 803a and the corner portion 803b of the lower film 803 may be formed of different materials, respectively. The central portion 803a may be formed of a material having a relatively large modulus. For example, the central portion 803a may be formed of polyurethane. The corner portion 803b may be formed of a material having a relatively small modulus. For example, the corner portion 803b may be formed of polyethylen terephthalate (PET). However, embodiments of the present inventive concepts are not limited thereto.

When the lower film 800 is formed by the inkjet device 900, a thickness of each portion of the lower film 800 may be formed differently. For example, referring to the embodiments of FIGS. 3 and 4, the central portion 802a and the side portion 802b of the lower film 802 may have different thicknesses. The thickness h1 of the central portion 802a of the lower film 802 may be formed to be thinner than the thickness h2 of the side portion 802b.

In the method of manufacturing the display device according to an embodiment of the present inventive concepts, when the lower film 800 is irradiated with ultraviolet light (UV), since the light absorbing layer 700 absorbs the ultraviolet light (UV), the ultraviolet light (UV) may not reach the polyimide included in the substrate 100. An influence on the polyimide included in the substrate 100 by ultraviolet light (UV) may be minimized. In this embodiment, the dielectric constant and a polarization amount of the polyimide may decrease. Accordingly, the polarization of the polyimide may be reduced, and the occurrence of an afterimage effect of the display device 12 may decrease.

When the lower film 800 is formed by an inkjet process, the manufacturing cost of the display device 12 may be reduced compared to when a patterned lower film is attached to the substrate 100.

By forming the lower film 800 by the inkjet process, each portion of the lower film 800 may be formed of a different material. In addition, the thickness of each portion of the lower film 800 may be formed differently. Accordingly, a structure of the lower film 800 may be formed in various arrangements.

The display device according to an embodiment may be applied to a display device of various types of electronic devices, including a computer, a notebook, a mobile phone, a smartphone, a smart pad, a PMP, a PDA, an MP3 player, or the like. However, embodiments of the present inventive concepts are not limited thereto.

What is claimed is:

1. A display device comprising:
   a lower film including a first area having a first modulus and a second area having a second modulus different from the first modulus, the first area and the second area are composed of different materials from each other;
   a light absorbing layer disposed on the lower film, the light absorbing layer is configured to absorb ultraviolet light having a transmittance in a range of about 10% or less;
   a substrate disposed on the light absorbing layer;
   a thin film transistor disposed on the substrate and including a gate electrode, a source electrode and a drain electrode; and
   a light emitting diode disposed on the thin film transistor and electrically connected to the thin film transistor and
   the first area is coplanar with the second area in a plan view.

2. The display device of claim 1, wherein the substrate includes polyimide (PI).

3. The display device of claim 1, wherein materials of the substrate are electrically neutral or electrically quasineutral.

4. The display device of claim 1, wherein the light absorbing layer includes at least one compound selected from graphene, carbon nanotube, graphene oxide and reduced graphene oxide.

5. The display device of claim 1, wherein a modulus of the light absorbing layer is in a range of about 0.1 MPa to about 250 MPa.

6. The display device of claim 1, wherein a thickness of the light absorbing layer is in a range of about 1 micrometer to about 25 micrometers.

7. The display device of claim 1, wherein:
   the lower film further includes a third area having a third modulus different from the first modulus;
   the first area is disposed between the second area and the third area in the plan view; and
   the second modulus and the third modulus are greater than the first modulus.

8. The display device of claim 7, wherein:
   the first area is composed of a bendable material; and
   each of the second area and the third area are composed of a non-bendable material.

9. The display device of claim 1, wherein: the first area is disposed in a center of the lower film, the second area is disposed in at least one corner of the lower film; and the first modulus is greater than the second modulus.

\* \* \* \* \*